United States Patent [19]

Rein

[11] Patent Number: 5,736,905
[45] Date of Patent: Apr. 7, 1998

[54] SYNCHRONIZABLE POWER SUPPLY OSCILLATOR

[75] Inventor: John M. Rein, Elgin, Ill.

[73] Assignee: Northrop Grumman Corporation, Los Angeles, Calif.

[21] Appl. No.: 652,221

[22] Filed: May 23, 1996

[51] Int. Cl.⁶ .................................................. H03B 5/24
[52] U.S. Cl. ........................ 331/143; 331/153; 331/172; 331/DIG. 3; 327/141
[58] Field of Search ........................ 331/111, 113 R, 331/143–145, 153, 172, DIG. 3; 327/141, 142, 143

[56] References Cited

U.S. PATENT DOCUMENTS

| 3,651,427 | 3/1972 | Rolfes et al. | 331/153 |
| 4,309,675 | 1/1982 | Rabe | 331/172 |
| 4,429,233 | 1/1984 | Kammiller | 307/87 |
| 4,694,388 | 9/1987 | Losel | 363/72 |
| 4,812,959 | 3/1989 | Driscoll et al. | 363/20 |
| 4,886,981 | 12/1989 | Lentini et al. | 307/87 |
| 4,980,655 | 12/1990 | Whilehead | 331/DIG. 3 X |
| 5,130,561 | 7/1992 | Elliott et al. | 307/31 |
| 5,142,217 | 8/1992 | Gontowski, Jr. | 323/272 |

Primary Examiner—David Mis
Attorney, Agent, or Firm—Terry J. Anderson; Karl J. Hoch, Jr.

[57] ABSTRACT

A dual-multivibrator circuit using a pair of mutually triggering multivibrator sections is connected to operate in a free-running mode when no external synchronization signal is applied to the circuit input, and in synchronism with a master pulse train of substantially the same pulse repetition rate when such a master pulse train is applied to the circuit input.

6 Claims, 2 Drawing Sheets

SYNCHRONIZABLE POWER SUPPLY OSCILLATOR

FIELD OF THE INVENTION

This invention relates to a synchronizable oscillator for microwave power modules, and more particularly to an oscillator which can be used without alteration in single modules or in centrally synchronized modules whose microwave output is paralleled with that of other modules.

BACKGROUND OF THE INVENTION

Power supplies for microwave systems, particularly in the avionics field, are advantageously designed in modular form. This allows the use of a single type of module for many different applications; for low-power applications, a module may be used alone, or for higher-power applications, the microwave outputs of the modules may be paralleled. Savings are thus achieved in manufacturing cost, inventory control and maintenance.

In a typical use of the invention, each module should have the ability to individually produce a pulse train at an appropriate frequency when it is not connected to any other module or synchronization source. When it is connected to other modules in a multiple module arrangement, each module should produce, without any physical or electrical alteration, a pulse train of a similar frequency in synchronism with an externally produced master pulse train. One type of equipment requiring multiple modules is a phased array. In such an application, the paralleled modules would produce a high-power synchronized microwave-frequency output. The required synchronization is typically provided by a separate master oscillator in the system-level circuitry.

Synchronized parallel operation of pulse width modulated power supply controllers is the subject of several prior art patents. For example, Gontowski Jr. U.S. Pat. No. 5,142,217 shows a system in which the oscillator running at the highest frequency in a group of oscillators automatically functions as the master of the group; Elliott et al. U.S. Pat. No. 5,130,561 synchronize two oscillators 180° out of phase but removes the synchronization if an overload occurs; Lentini et al. U.S. Pat. No. 4,886,981 generate a separate activation signal, with the first synchronizing unit to receive the activation signal becoming the master; Driscoll et al. U.S. Pat. No. 4,812,959 extend the off-time of the pulse to coincide with an external synchronization signal; Losel U.S. Pat. No. 4,964,388 discloses a master-slave arrangement which requires the master to have a higher frequency than the slaves; Kammiller U.S. Pat. No. 4,429,233 shows parallel-connected power supplies in which the highest-frequency controller is the master; Rolfes et al. U.S. Pat. No. 3,651,427 synchronize an oscillator in a standby power supply with the AC line; and Rabe U.S. Pat. No. 4,309,675 synchronizes an oscillator to the natural frequency of a mechanical system.

None of the prior art systems, however, show a simple cost-effective arrangement in which a microwave power module runs independently when alone, yet in synchronism with other modules when they are connected to a common master pulse train source. It is therefore desirable to provide a simple oscillator circuit that can operate either at a fixed frequency on its own, or in synchronism with an externally applied pulse train whenever such a pulse train is present.

As such, although the prior art has recognized to a limited extent the problem of selective synchronization, the proposed solutions have, to date, been ineffective in providing a satisfactory remedy.

SUMMARY OF THE INVENTION

The present invention provides a simple and effective way of operating the same oscillator at the same frequency either alone or as part of a group of externally synchronized oscillators. In accordance with the invention, a dual monostable multivibrator circuit is self-triggered in the absence of an output pulse train from a master oscillator but is triggered by the master pulse train whenever it is present. This is achieved by causing master oscillator pulses at the circuit's input to disable the pulse rate-setting section of the dual monostable multivibrator while triggering its pulse width-setting section.

These, as well as other advantages of the present invention will be more apparent from the following description and drawings. It is understood that changes in the specific structure shown and described may be made within the scope of the claims without departing from the spirit of the invention.

DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and the sequence of steps for constructing and operating the invention in connection with the illustrated embodiment. It is to be understood, however, that the same or equivalent funtions and sequences may be accomplished by different embodiments that are also intended to be encompassed within the spirit and scope of the invention.

Figure 1:
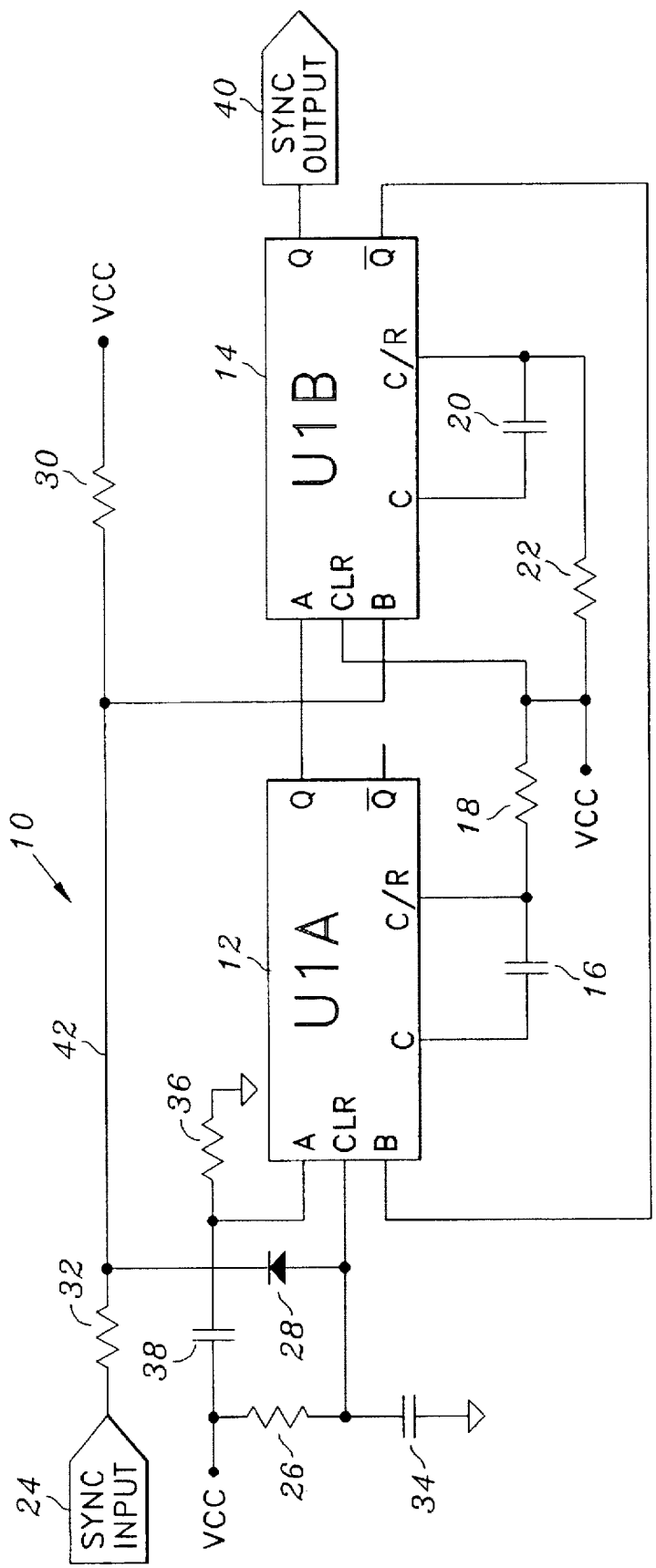
FIG. 1 is a circuit diagram showing the oscillator circuit of this invention.

As shown in FIG. 1, the circuit 10 of this invention employs a dual monostable multivibrator consisting of a pulse rate-setting section 12 and a pulse width-setting section 14. In each of these sections, A designates an input which triggers the Q output on the falling edge of an applied signal, B designates an input which triggers the Q output on the rising edge of an applied signal, and C and C/R are the output and input, respectively, which set the duration of the "1" state of Q in accordance with the values of capacitor 16 and resistor 18 (for section 12) or capacitor 20 and resistor 22 (for section 14). CLR designates an input which prevents operation of the section unless a sufficient enabling voltage is applied to CLR.

The voltage divider formed by resistors 30, 32 is so proportioned that when a signal is applied to the circuit input 24, line 42 is essentially at the level of that signal. However, if the circuit input 24 is disconnected, the voltage on line 42 will be essentially $V_{cc}$ (i.e. the power supply voltage representing logic "1"). Prior to powering up, all inputs to the multivibrator sections 12 and 14 are at ground due to the absence of $V_{cc}$. Upon power-up, the circuit 10 functions as follows:

a) Independent operation

On power-up (left portion of FIG. 2), the CLR input is originally held low by capacitor 34 for a reason discussed below. Gradually, as capacitor 34 charges through resistor 26, the voltage at the CLR input of section 12 rises and eventually allows section 12 to be triggered. Meanwhile, the appearance of $V_{cc}$ initially drives the A input of section 12 high through capacitor 38. The time constant of the RC circuit formed by capacitor 38 and resistor 36 is such as to prevent the A input of section 12 from going through the low voltage triggering threshold until the CLR input of section 12 has enabled section 12. The passage of the A input voltage through the low voltage threshold amounts to producing a falling edge at the A input of section 12, which triggers section 12. Section 12 now produces a "1" at its Q output which has no effect because the A input of section 14, to which it is connected, requires a falling edge for triggering. However, when section 12 then times out after a time interval determined by the time constant of the RC circuit formed by capacitor 16 and resistor 18, a falling edge does occur at the Q output of section 12, and this triggers section 14. When section 14 times out after a time interval determined by the time constant of the RC circuit formed by capacitor 20 and resistor 22, a rising edge is produced at its Q output. This rising edge triggers section 12 through its B input (the A input of section 12 now remains low and no longer has any effect), and the dual multivibrator formed by sections 12 and 14 continues to free-run (right portion of FIG. 2), each section triggering the other. In this mode, the sum of the time constants of the RC circuits 16, 18 and 20, 22 determines the output pulse repetition rate at circuit output 40, while the time constant of the RC circuit 20, 22 alone determines the output pulse width.

Figure 2:
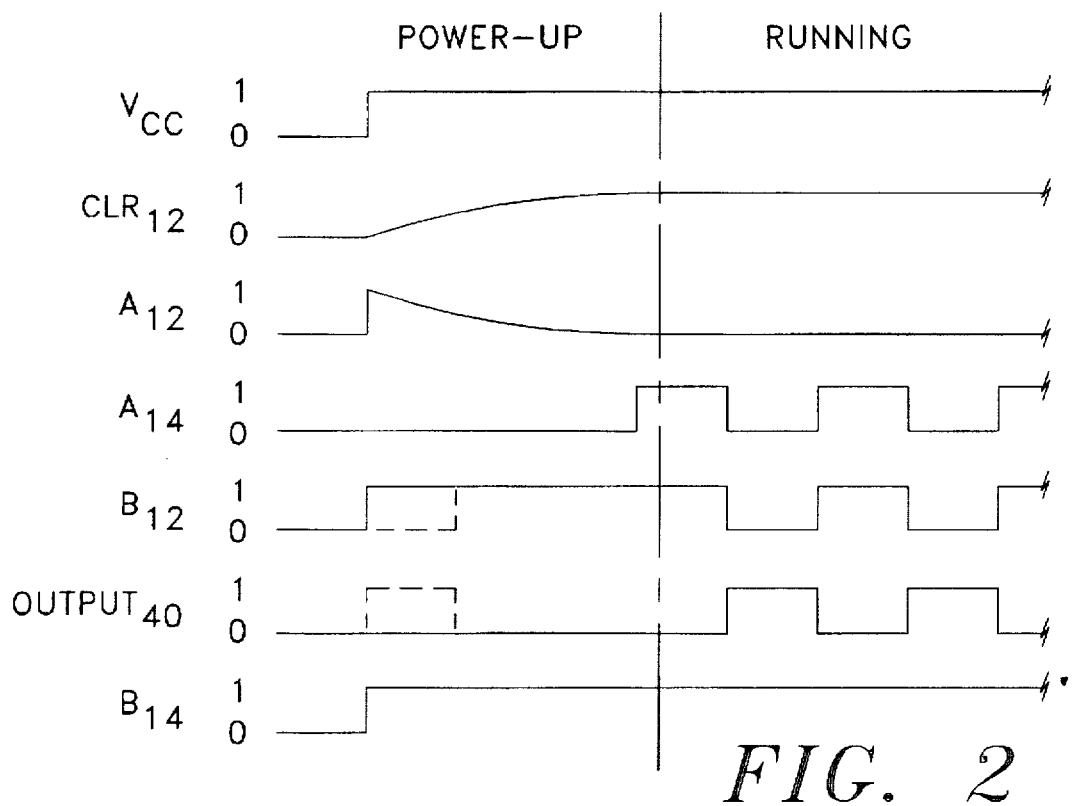
FIG. 2 is a time-amplitude diagram illustrating the logic levels of various signals in the free-running operation of the circuit of FIG. 1.

On power-up, if no signal is applied to circuit input 24, a spurious first output pulse may also be produced by a trigger of section 14 through the rising edge of $V_{cc}$ applied to its B input concurrently with its CLR input going high (dotted lines in FIG. 2). However, this has no effect on the circuit, as the rising edge of the B input of section 12, which is caused by the time-out of section 14, occurs at a time when the CLR input of section 12 is not yet high enough to allow triggering of section 12.

b) Synchronized operation

Figure 3:
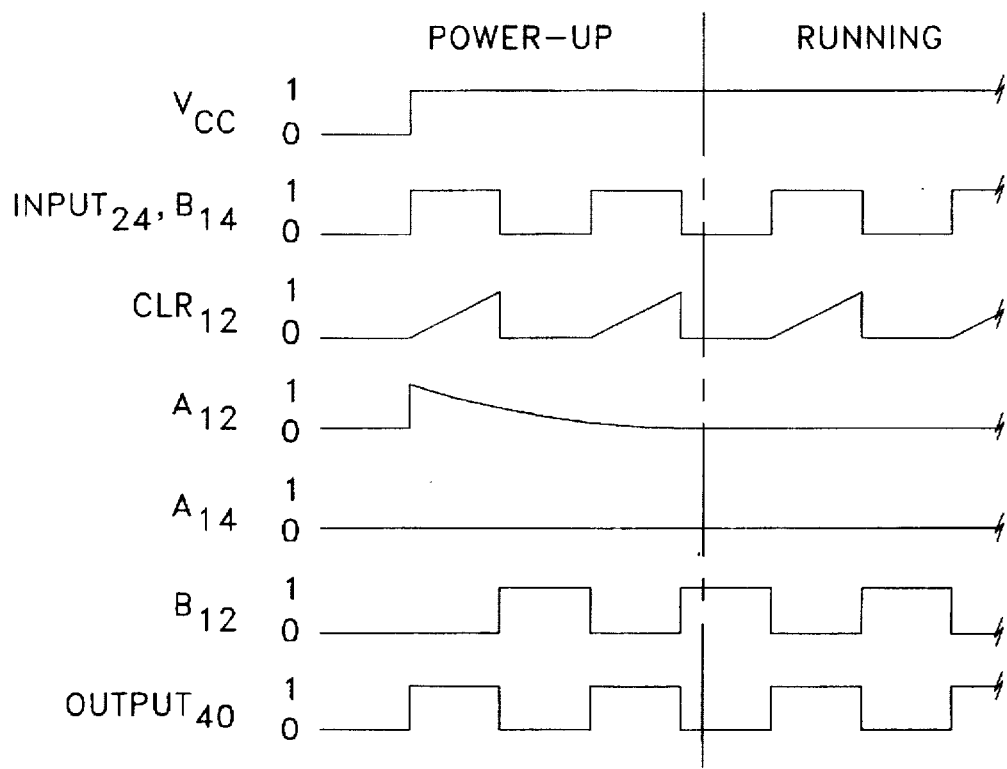
FIG. 3 is a time-amplitude diagram illustrating the logic levels of various signals in the externally synchronized operation of the circuit of FIG. 1.

If it is desired to synchronize the circuit output 40 with an external master pulse train (FIG. 3), it is merely necessary to apply the master pulse train to circuit input 24. During the low portions of the master pulse train, diode 28 keeps capacitor 34 discharged and the CLR input of section 12 low. The time constant of the RC circuit 26, 34 is sufficiently longer than the high portions of the master pulse train to prevent the CLR input of section 12 from rising significantly. Section 12 is thus disabled, and section 14, instead of being triggered by the falling edge of the Q output of section 12, is triggered by the rising edge of each master pulse through the B input of section 14. Consequently, the circuit 10 continues to put out pulses of the same width as when it is free-running, but the leading edges of those pulses are precisely synchronized with the leading edges of the master pulses applied to circuit input 24.

It is understood that the examplary digital oscillator described herein and shown in the drawings represents only a presently preferred embodiment of the invention. Indeed, various modifications and additions may be made to such embodiment without departing from the spirit and scope of the invention. Thus, other modifications and additions may be obvious to those skilled in the art and may be implemented to adapt the present invention for use in a variety of different applications.

I claim:

1. A free-running pulse generator circuit capable of being selectively synchronized with a master pulse train of substantially the same pulse repetition rate, comprising:
   a) first and second multivibrator sections arranged to trigger each other in a free running mode to produce an output pulse train at the output of said second section;
   b) a circuit input so connected to said first and second sections as to cause said sections to operate in said free-running mode when no master pulse train is applied to said input; and
   c) a control circuit arranged to disable said first section, and to cause said second section to be triggered from said circuit input, when a master pulse train alternating between a first voltage and a second voltage is applied to said circuit input.

2. The circuit of claim 1, in which said control circuit includes a resistive-reactive circuit which produces a disabling input to said first section when said second voltage is applied to said circuit input, and which has a time constant sufficient to maintain said disabling input during the first voltage portions of said input pulse train.

3. The circuit of claim 1, in which said second section is triggered by the falling edges of the output of said first section in said free-running mode, and by the rising edges of said input pulse train when said first section is disabled.

4. The circuit of claim 1, in which said first section includes an input terminal arranged to trigger said first section upon the transition of a signal applied to said input terminal from said first voltage to said second voltage, and a reactive-resistive circuit so connected to said input terminal and to a circuit power source that a single first-voltage-to-second-voltage transition at said input terminal is produced upon power-up.

5. The circuit of claim 1, in which in said free-running mode, said second section is triggered by the falling edges of the output of said first section, and said first section is triggered by the rising edges of the inverted output of said second section.

6. A selectively externally microwave power supply module, comprising:
   a) first and second digital multivibrators, each having first (A) triggering inputs arranged to start the count of said multivibrators on a falling logic edge, second (B) triggering inputs arranged to start the count of said multivibrators on a rising logic edge, first (Q) and second (Q) outputs of opposite logic levels, the Q output being high and the Q output low during the count, and a clear (CLR) input disabling its multivibrator when low;
   b) a power source;
   c) a source of master pulses;
   d) a first time-constant network interconnecting said power source and the A input of said first multivibrator so as to trigger said first multivibrator a first predetermined time following energization of said power source;
   e) a second time-constant network interconnecting said power source and the CLR input of said first multivibrator so as to enable said first multivibrator a second predetermined time after energization of said power source;
   f) timing means associated with said first and second multivibrator, respectively, so as to set the on times of said first and second multivibrators, respectively;

g) said B input of said second multivibrator being so connected to said master pulse source and said power source as to be low when said master pulse source is low, and high at all other times; and h) diode means interconnecting said B input of said second multivibrator and said CLR input of said first multivibrator so as to drive said CLR input low when said master pulse source is low;

i) said Q output of said first multivibrator being connected to said A input of said second multivibrator, and said Q output of said second multivibrator being connected to said B input of said first multivibrator; and j) said CLR output of said second multivibrator being connected to said power source; and k) said Q output of said second multivibrator constituting a pulse train output which is synchronized with the pulse train of said pulse train source when said source pulse train is present, but generates an independent pulse train when said source pulse train is absent.

* * * * *

UNITED STATES PATENT AND TRADEMARK OFFICE
CERTIFICATE OF CORRECTION

PATENT NO. : 5,736,905
DATED : April 7, 1998
INVENTOR(S) : John M. Rein

It is certified that error appears in the above-identified patent and that said Letters Patent is hereby corrected as shown below:

First paragraph of specification after title and before field of invention:

STATEMENT OF GOVERNMENT RIGHTS

This invention was made with Government Support under contract F33615-91-C-1815 awarded by the United States Air Force. The Government has certain rights in this invention.

Signed and Sealed this

Nineteenth Day of March, 2002

Attest:

JAMES E. ROGAN
Director of the United States Patent and Trademark Office

Attesting Officer